United States Patent
Lee et al.

(10) Patent No.: US 12,095,013 B2
(45) Date of Patent: Sep. 17, 2024

(54) RADIATION-EMITTING DEVICE AND METHOD FOR PRODUCING A PLURALITY OF RADIATION-EMITTING DEVICES

(71) Applicant: OSRAM Opto Semiconductors GmbH, Regensburg (DE)

(72) Inventors: Ee Lian Lee, Balik Pulau (MY); Boon Liang Yap, Penang (MY); Prakash Rajah, Penang (MY)

(73) Assignee: OSRAM Opto Semiconductors GmbH, Regensburg (DE)

(*) Notice: Subject to any disclaimer, the term of this patent is extended or adjusted under 35 U.S.C. 154(b) by 442 days.

(21) Appl. No.: 17/430,283

(22) PCT Filed: Apr. 12, 2019

(86) PCT No.: PCT/EP2019/059540
§ 371 (c)(1),
(2) Date: Aug. 11, 2021

(87) PCT Pub. No.: WO2020/207604
PCT Pub. Date: Oct. 15, 2020

(65) Prior Publication Data
US 2022/0077361 A1    Mar. 10, 2022

(51) Int. Cl.
*H01L 33/58* (2010.01)
*H01L 33/00* (2010.01)
*H01L 33/54* (2010.01)

(52) U.S. Cl.
CPC ............ *H01L 33/58* (2013.01); *H01L 33/005* (2013.01); *H01L 33/54* (2013.01); *H01L 2933/005* (2013.01); *H01L 2933/0058* (2013.01)

(58) Field of Classification Search
CPC ....... H01L 33/005; H01L 33/54; H01L 33/58; H01L 2933/005; H01L 2933/0058
See application file for complete search history.

(56) References Cited

U.S. PATENT DOCUMENTS

2013/0322068 A1    12/2013    Clark et al.

FOREIGN PATENT DOCUMENTS

| CN | 104253188 A | * 12/2014 | ............ H01L 25/13 |
| EP | 2056363 A2 | 5/2009 | |
| EP | 2190040 A2 | * 5/2010 | ........... H01L 33/483 |
| WO | 2016046200 A1 | 3/2016 | |
| WO | 2016146200 A1 | 9/2016 | |

* cited by examiner

*Primary Examiner* — Robert G Bachner
*Assistant Examiner* — Molly K Reida
(74) *Attorney, Agent, or Firm* — Slater Matsil, LLP

(57) ABSTRACT

In an embodiment a method for producing a plurality of radiation-emitting devices includes providing a plurality of semiconductor chips on a main surface of a carrier, each semiconductor chip for emitting electromagnetic radiation from a radiation exit surface, arranging a lens mold with a plurality of cavities over the carrier, introducing a liquid mold material into the cavities of the lens mold and curing the liquid mold material such that a plurality of molded lenses is generated, wherein the molded lenses directly adjoin the main surface of the carrier, wherein regions of an outer surface of the molded lenses directly adjacent to the main surface of the carrier are free of planar areas, and wherein the carrier includes a plurality of carrier elements, the carrier elements having a first recess in a main surface extending from a side face of the carrier element.

10 Claims, 4 Drawing Sheets

RADIATION-EMITTING DEVICE AND METHOD FOR PRODUCING A PLURALITY OF RADIATION-EMITTING DEVICES

This patent application is a national phase filing under section 371 of PCT/EP2019/059540, filed Apr. 12, 2019, of which is incorporated herein by reference in its entirety.

TECHNICAL FIELD

A radiation-emitting device and a method for producing a plurality of radiation-emitting devices are provided.

SUMMARY

Embodiments provide a radiation-emitting device with enhanced efficiency. Further embodiments provide a method for producing such a radiation-emitting device in a simplified manner.

According to an embodiment, the radiation-emitting device comprises a semiconductor chip. The semiconductor chip emits electromagnetic radiation from a radiation exit surface during operation. For example, the semiconductor chip emits electromagnetic radiation from the ultraviolet, visible and/or the infrared spectral range.

Preferably, the radiation-emitting device further comprises a carrier element. According to an embodiment of the radiation-emitting device, the semiconductor chip is arranged on a main surface of the carrier element. For example, the carrier element comprises a core element and through holes for electrically contacting the semiconductor chip positioned on a main surface of the carrier element. Also, electrical contact areas might be comprised by the carrier element. Preferably, the electrical contact areas cover the trough holes.

According to a further embodiment of the radiation-emitting device, the radiation-emitting device comprises a molded lens. Particularly preferably, the molded lens is manufactured on the carrier element and not manufactured separately from the carrier element and the semiconductor chip and mounted afterwards to the carrier element. This simplifies the manufacturing of the radiation-emitting device.

Preferably, the molded lens is arranged over the radiation exit surface of the semiconductor chip. Particularly preferably, the molded lens is arranged over the radiation exit surface of the semiconductor chip in such a manner that substantially all electromagnetic radiation emitted from the radiation exit surface of the semiconductor chip incidents in the molded lens. The term "substantially all electromagnetic radiation emitted from the radiation exit surface of the semiconductor chip" means in this context in particular that at least 95% of the electromagnetic radiation emitted from the radiation exit surface of the semiconductor chip incidents in the molded lens.

Particularly preferably, the semiconductor chip is embedded within the molded lens at least partially. Preferably, all surfaces of the semiconductor chip, which is not in direct contact with the carrier element is covered by the molded lens. Particularly preferably, the molded lens encapsulates the semiconductor chip and protects the semiconductor chip against harmful external influences. In such a way, the molded lens satisfies at least two different functions. Firstly, the molded lens shapes the radiation characteristic of the radiation-emitting device in a desired manner. Secondly, the molded lens acts as protection of the semiconductor chip.

According to a further embodiment of the radiation-emitting device, the molded lens is transparent for the electromagnetic radiation of the semiconductor chip. For example, the molded lens transmits at least 85% of the electromagnetic radiation emitted by the semiconductor chip. Particular preferably, the molded lens transmits at least 95% of the electromagnetic radiation emitted by the semiconductor chip. For example, the molded lens comprises a resin or consists of a resin. For example, the resin is chosen from the group consisting of silicon, epoxy or a mixture of silicone and epoxy.

According to an embodiment of the radiation-emitting device, the molded lens directly adjoins the main surface of the carrier element. In other words, the molded lens is particularly preferably in direct physical contact with the main surface of the carrier element.

According to a preferred embodiment of the radiation-emitting device, a region of an outer surface of the molded lens directly adjacent to the main surface of the carrier element is free of planar areas. Particularly preferably, the molded lens is free of a base region directly adjoining the main surface of the carrier element, wherein the base region has the shape of a substantially homogenous layer. In common devices such a homogenous layer in the base region directly adjoining the main surface of the carrier element might have a thickness of about 100 micrometer. A radiation-emitting device with a molded lens having a region of an outer surface directly adjacent to the main surface of the carrier element being free of planar areas has the advantage that total internal reflection of radiation emitted by the semiconductor chip is reduced. In particular, a base region having the shape of a substantially homogenous layer leads to trapping of radiation and a loss of efficiency.

For example, the molded lens has an outer surface with the shape of a hemispherical shell. In this case, the region directly adjacent to the main surface of the carrier element forms part of a hemisphere shell, which is free of planar areas. Particularly preferably, the hemisphere shell has a surface with a curvature in every point.

Particularly preferably, a radiation cone of the electromagnetic radiation emitted by the radiation-emitting device has an opening angle of substantially 180°.

According to a further embodiment of the radiation-emitting device, a semiconductor chip comprises a substrate and an epitaxial semiconductor layer sequence arranged on the substrate. Particularly preferably, the substrate is transparent for electromagnetic radiation of the semiconductor chip. The term "transparent" means in this context in particular that the substrate transmits at least 85% and particularly preferably at least 95% of the electromagnetic radiation of the semiconductor chip.

According to a further embodiment of the radiation-emitting device, the semiconductor chip emits electromagnetic radiation from a side face. In particular, the semiconductor chip might be a so-called "volume-emitting" semiconductor chip.

The volume-emitting semiconductor chip comprises the epitaxial semiconductor layer sequence with a radiation generating active zone, wherein the electromagnetic radiation of the semiconductor chip is generated during operation. The substrate of the volume-emitting semiconductor chip comprises a first main extension face and a second main extension face opposite to the first main extension face and a side face arranged between the first main extension face and the second main extension face.

The semiconductor layer sequence of the volume-emitting semiconductor chip is epitaxially grown on the first main extension face of the substrate. The substrate is particularly preferably transparent at least for the electromagnetic radiation generated in the active zone. For example, the substrate comprises or consists of one of the following materials: sapphire, silicon carbide. The volume-emitting semiconductor chip emits radiation generated within the active zone via one of its main extension faces and also via side faces, which are formed by side faces of the substrate. In other words, the radiation exit surface of the volume-emitting semiconductor chip comprises besides a main extension face of the semiconductor chip also side faces of the semiconductor chip at least in places.

The second main extension face of the substrate shows to a back side of the volume-emitting semiconductor chip or forms a back side of the volume-emitting semiconductor chip. A front side of the volume-emitting semiconductor chip arranged opposite to back side comprises preferably at least two electric contacts for electrical connection of the semiconductor chip, for example with the help of bond wires.

For example, the epitaxial semiconductor layer sequence is based on a nitride semiconductor compound material, on a phosphide semiconductor compound material or an arsenide compound semiconductor material.

Nitride semiconductor compound materials are compound semiconductor materials containing nitrogen, such as the materials from the system $In_xAl_yGa_{1-x-y}N$ with $0 \leq x \leq 1$, $0 \leq y \leq 1$ and $x+y \leq 1$. An epitaxially semiconductor layer sequence based on a nitride semiconductor compound material has mostly an active zone generating electromagnetic radiation within the ultraviolet to blue spectral range. In particular, sapphire or silicon carbide are suited as materials for a growth substrate for an epitaxially semiconductor layer sequence based on a nitride semiconductor compound material. These materials are in general transparent for electromagnetic radiation from the ultraviolet to blue spectral range.

Phosphide semiconductor compound materials are compound semiconductor materials containing phosphor, such as the materials from the system $In_xAl_yGa_{1-x-y}P$ with $0 \leq x \leq 1$, $0 \leq y \leq 1$ and $x+y \leq 1$. An epitaxially semiconductor layer sequence based on a phosphide semiconductor compound material has mostly an active zone generating electromagnetic radiation within the green to red spectral range.

Arsenide semiconductor compound materials are compound semiconductor materials containing arsenide, such as the materials from the system $In_xAl_yGa_{1-x-y}As$ with $0 \leq x \leq 1$, $0 \leq y \leq 1$ and $x+y \leq 1$. An epitaxially semiconductor layer sequence based on an arsenide semiconductor compound material has mostly an active zone generating electromagnetic radiation within the red to infrared spectral range.

According to a further embodiment of the radiation-emitting device, the carrier element has a first recess in the main surface extending from a side face of the carrier element. For example, the first recess has a base area of trapezoidal shape. In particular, the base area might decrease from the side face of the carrier element.

According to a further embodiment of the radiation-emitting device, the carrier element has a second recess in the main surface extending from the side face of the carrier element. Particularly preferably, the second recess is arranged opposite to the first recess. For example, the carrier element has a rectangular shape and the first recess and the second recess are arranged such that they extend from opposite side faces. For example, the second recess has a base area of trapezoidal shape. In particular, the base area might decrease from the side face of the carrier element. Particularly preferably, the first recess and the second recess have the same base area.

According to a further preferred embodiment of the radiation-emitting device, the first recess is filled with the molded lens. Preferably, the first recess is completely filled with the molded lens.

According to a further preferred embodiment of the radiation-emitting device, the second recess is filled with the molded lens. Preferably, the second recess is completely filled with the molded lens.

Particularly preferably, the molded lens forms a continuous surface together with the side faces of a carrier element. In other words, the molded lens is preferably flush with the side faces of the carrier element.

According to a preferred embodiment, the radiation-emitting device comprises a semiconductor chip emitting electromagnetic radiation from a radiation exit surface during operation, said semiconductor chip being arranged on a main surface of a carrier element and a molded lens over the radiation exit surface of the semiconductor chip, said molded lens directly adjoining the main surface of the carrier element, wherein a region of an outer surface of the molded lens directly adjacent to the main surface of the carrier element are free of planar areas.

The radiation-emitting device disclosed so far can be produced with the method described in the following. Embodiments, features and developments described in connection with the radiation-emitting device can also be embodied by the method and vice versa.

According to an embodiment of the method for producing a plurality of radiation-emitting devices, a plurality of semiconductor chips is provided on a main surface of a carrier. Each semiconductor chip emits particularly preferably electromagnetic radiation from a radiation exit surface during operation.

According to a further embodiment of the method for producing a plurality of radiation-emitting devices, a lens mold is arranged over the carrier. Particularly preferably the lens mold comprises a plurality of cavities. For example, the cavities are embodied in the same manner. For example, the cavities have the same shape.

According to a further embodiment of the method, a liquid mold material is introduced into the cavities of the lens mold. For example, the liquid mold material is introduced into the cavities of the lens mold by injection. Particularly preferably, the liquid mold material is inserted at a single injection point of the compound comprising the semiconductor chips, the carrier and the lens mold.

According to a further embodiment of the method, the liquid mold material is cured such that a plurality of molded lenses is generated. The cavities of the lens mold are preferably used as inverted forms for the molded lenses. Therefore, the shape of the cavities corresponds to the shape of the molded lenses. In particular, the surface of the cavities corresponds to the outer surface of the molded lenses. Preferably, the surfaces of the cavities and the surfaces of the molded lenses have the shape of a hemispherical shell.

Particularly preferably, over each semiconductor chip a single cavity is positioned. For example, the cavities have the shape of a hemispherical shell and each hemispherical shell is positioned over one semiconductor chip such that a vortex of the hemispherical shell is positioned above a centre of a main surface of a semiconductor chip.

According to a further embodiment of the method, the molded lenses directly adjoin the main surface of the carrier after molding.

Particularly preferably, an outer surface of the molded lenses directly adjacent to the main surface of the carrier is free of planar areas.

According to a further embodiment of the method, the carrier comprises or consists of a plurality of carrier elements. Particularly preferably, each carrier element has a first recess in a main surface extending from the side face of the carrier element. In other words, particularly preferably the carrier is comprises carrier elements each having at least one first recess in a main surface.

According to a preferred embodiment, the method for producing a plurality of radiation-emitting devices comprises the following steps:
  providing a plurality of semiconductor chips on a main surface of a carrier, each semiconductor chip emitting electromagnetic radiation from a radiation exit surface during operation,
  arranging a lens mold with a plurality of cavities over the carrier,
  introducing a liquid mold material into the cavities of the lens mold,
  curing the liquid mold material such that a plurality of molded lenses is generated, wherein
  the molded lenses directly adjoin the main surface of the carrier, and
  regions of an outer surface of the molded lenses directly adjacent to the main surface of the carrier are free of planar areas.

For example, the method can be conducted in the above given order.

Particularly preferably, the carrier elements have a second recess in a main surface extending from the side face of the carrier element. Particularly preferably, the second recess is arranged opposite to the first recess of each carrier element.

According to a particularly preferred embodiment of the method, the first recess and the second recess of direct neighbouring carrier elements form a continuous common recess within the carrier. Preferably, the continuous common recess connects two direct neighboring cavities of the lens mold with each other after placing the lens mold over the carrier.

According to a further embodiment of the method, the liquid mold material flows through the continuous common recess from one cavity to the direct neighboring cavity during the introduction of the liquid mold material into the lens mold. In other words, the first recesses and the second recesses of the carrier elements are arranged such that it is possible to fill all cavities of the lens mold with the liquid mold material in a single step.

For example, the liquid mold material comprises a liquid resin or consists of a liquid resin. For example, the liquid resin is chosen from the group consisting of liquid silicone, liquid epoxy or a mixture of liquid silicone and liquid epoxy. Particularly preferably, the liquid mold material is an uncured liquid silicone. For example, the resin is cured to a solid molded lens by polymerization.

For example, the uncured liquid mold material comprises a plurality of monomers. In a completely uncured state, the monomers are not connected to each other by chemical bonds. During polymerization, which can be initiated for example by UV-light or heat, monomers react chemically which each other to form chemical bonds until a predominant part of the monomers are connected to each other by chemical bonds.

Particularly preferably, the radiation-emitting devices are separated from each other after the curing of the liquid mold material. Particularly preferably, the separation takes place through separation lines running through the continuous common recesses. For example, the radiation-emitting devices can be separated by sawing or laser dicing.

According to a further embodiment of the method, each cavity of the lens mold is arranged over the radiation exit surface of a semiconductor chip.

According to a further embodiment of the method, the cavities have the inverted shape of the molded lenses to be formed.

It is an idea of the radiation-emitting device provided herein to enhance the efficiency of the radiation-emitting device by avoiding a mold base layer. Particularly preferably, the region of the outer surface of the molded lens, which is directly adjacent to the main surface of the carrier element, is free of planar areas. Particularly preferably, the molded lens is free of a base region directly adjoining the main surface of the carrier element, said base region having the shape of a homogenous layer. In such a way it is avoided that electromagnetic radiation is trapped by total internal reflection within the region directly adjacent to the carrier element and escapes through the planar areas of the molded lens, which are directly adjacent to the carrier element. Instead, the electromagnetic radiation of the radiation-emitting semiconductor chip can be directed in an opening angle of about 180° thus increasing the efficiency of the radiation-emitting device.

Further, as a simplified method for producing such a device, a batch process is provided. Essential for this batch process are the first recess and the second recess within the carrier elements allowing that the liquid mold material injected within the cavities of the lens mold can flow easily from one cavity to another. With the help of the first recess and the second recess a mold base layer can be avoided keeping simultaneously the manufacturing process simple.

BRIEF DESCRIPTION OF THE DRAWINGS

In the following, the radiation-emitting device and the method for the production of a plurality of radiation-emitting devices is described in further detail with the help of exemplary embodiments.

Equal or similar elements as well as elements of equal function are designated with the same reference signs in the Figures. The Figures and the proportions of the elements shown in the Figures are not regarded as being shown to scale. Rather, single elements, in particular layers, can be shown exaggerated in magnitude for the sake of better presentation and/or better understanding.

DETAILED DESCRIPTION OF ILLUSTRATIVE EMBODIMENTS

Figure 1:
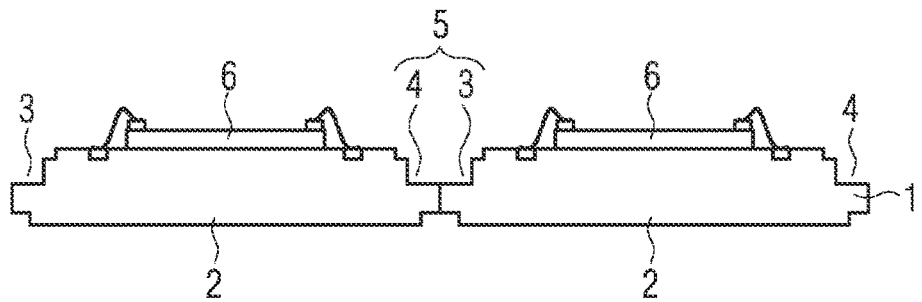
FIGS. 1 to 5 show in schematic sectional views different phases of a method for production of a plurality of radiation-emitting devices according to a first exemplary embodiment.

According to the method of the exemplary embodiment according to FIGS. 1 to 6, a carrier 1 is provided in a first step (FIG. 1). The carrier 1 comprises a plurality of carrier elements 2. For the sake of clarity, only two carrier elements 2 are shown in FIG. 1. Each carrier element 2 is provided with a first recess 3 and a second recess 4 in the main surface extending from a side face of the carrier element 2. The first recess 3 and the second recess 4 of direct neighbouring carrier elements 2 form a continuous common recess 5.

On a main surface of the carrier 1, a plurality of semiconductor chips 6 is provided. In particular, on a main surface of each carrier element 2 a radiation-emitting semiconductor chip 6 is provided. Each semiconductor chip 6 emits electromagnetic radiation from a radiation-exit surface during operation. Preferably, the semiconductor chips 6 emit blue light.

Figure 2:
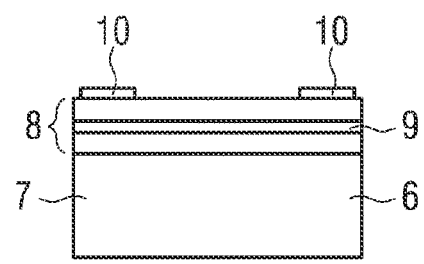

FIG. 2 shows exemplarily a radiation-emitting semiconductor chip 6 according to an embodiment. The semiconductor chip 6 might be used as a radiation-emitting semiconductor chip 6 during the method according to the embodiment of FIGS. 1 to 6. The radiation-emitting semiconductor chip 6 is described in further detail in connection with FIG. 2.

The radiation-emitting semiconductor chip 6 of FIG. 2 comprises a substrate 7 comprising sapphire or consisting of sapphire. On a main extension face of the sapphire substrate 7 an epitaxial semiconductor layer sequence 8 is epitaxially grown. The epitaxial semiconductor layer sequence 8 is based on a nitride compound semiconductor material. The epitaxial semiconductor layer sequence 8 comprises an active zone 9, which generates blue light as electromagnetic radiation during operation. The sapphire substrate 7 is transparent for the blue light generated by the active zone 9. At a front side of the radiation-emitting semiconductor chip 6 two electrical contacts 10 are positioned.

The radiation-emitting semiconductor chip 6 of FIG. 2 emits electromagnetic radiation from a radiation exit surface during operation. The radiation exit surface comprises besides a main extension face of the radiation-emitting semiconductor chip 6 also side faces of the transparent substrate 7. In other words, the radiation-emitting semiconductor chip 6 according to FIG. 2 is a volume-emitting semiconductor chip 6.

Figure 3:
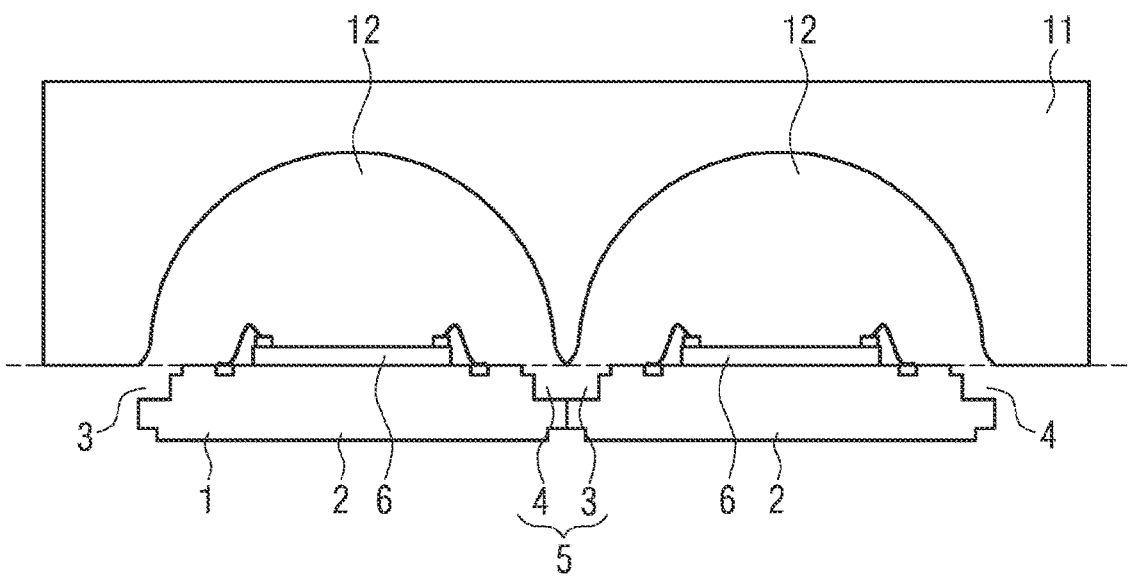

In a next step of the method of the exemplary embodiment of FIGS. 1 to 6, a lens mold 11 is arranged over the carrier 1 (FIG. 3). In particular, there is no gap between the lens mold 11 and the carrier 1 (see the dashed line in FIG. 3). The lens mold 11 comprises a plurality of cavities 12. For the sake of clarity, only two cavities 12 are shown in FIG. 3. The cavities 12 have a surface formed as a hemispherical shell. In particular, the surface of each cavity 12 is formed such that a region directly adjacent to the main surface of the carrier element 2 is free of planar areas. The lens mold 11 is arranged such above the carrier 1 that a vortex of the hemispherical shell is positioned above a centre of a main surface of the semiconductor chip 6.

In a next step, a liquid mold material 13 such as a liquid uncured silicone is introduced into the cavities 12 of the lens mold 11 (FIG. 4), for example by injection. The liquid mold material 13 is introduced into the cavities 12 at a single injection point of the compound of the carrier 1 and the lens mold 11 or at several injection points of the compound of the carrier 1 and the lens mold 11. However, it is not necessary that the liquid mold material 13 is injected in every cavity 12 in a separate way.

Figure 4:
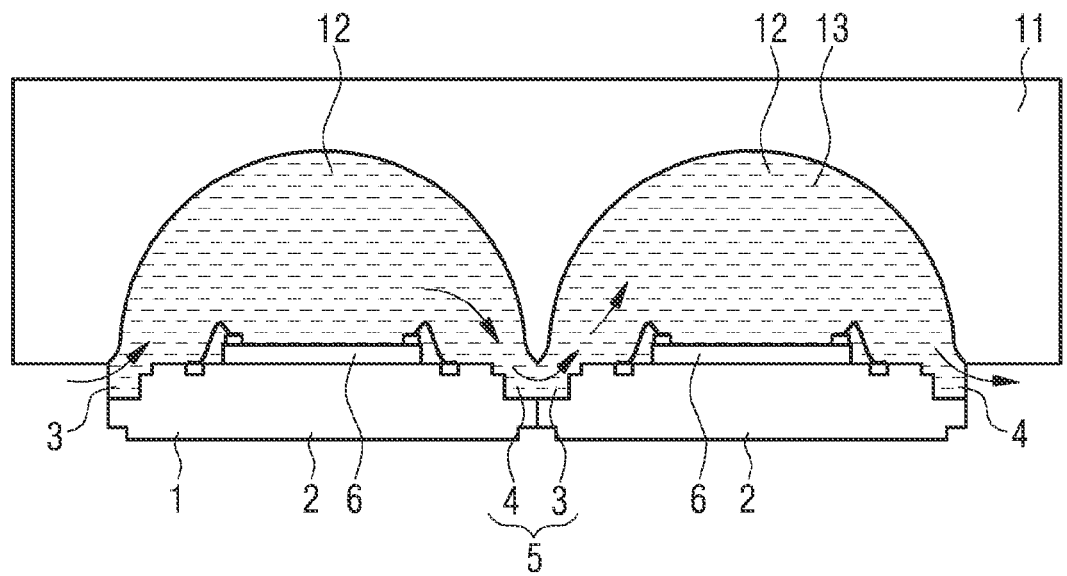

As indicated by the arrows in FIG. 4, the liquid mold material 13 can flow from one cavity 12 to the direct neighbouring cavity 12 due to the common recess 5 formed in the main surface of the carrier 1 by the first recess 3 and second recess 4 of direct neighbouring carrier elements 2.

In a next step, the liquid mold material 13 is cured, for example by polymerization such that molded lenses 14 are generated. After curing of the liquid mold material 13 the lens mold 11 is removed (FIGS. 5 and 6).

Figure 5:
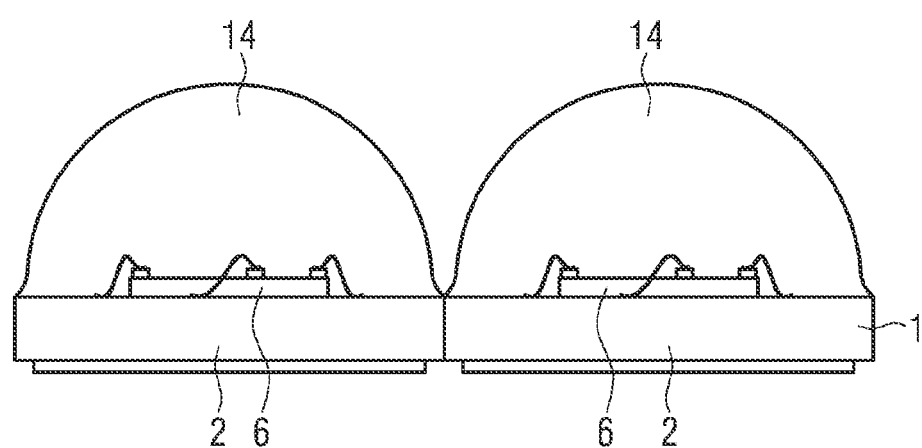
Figure 6:
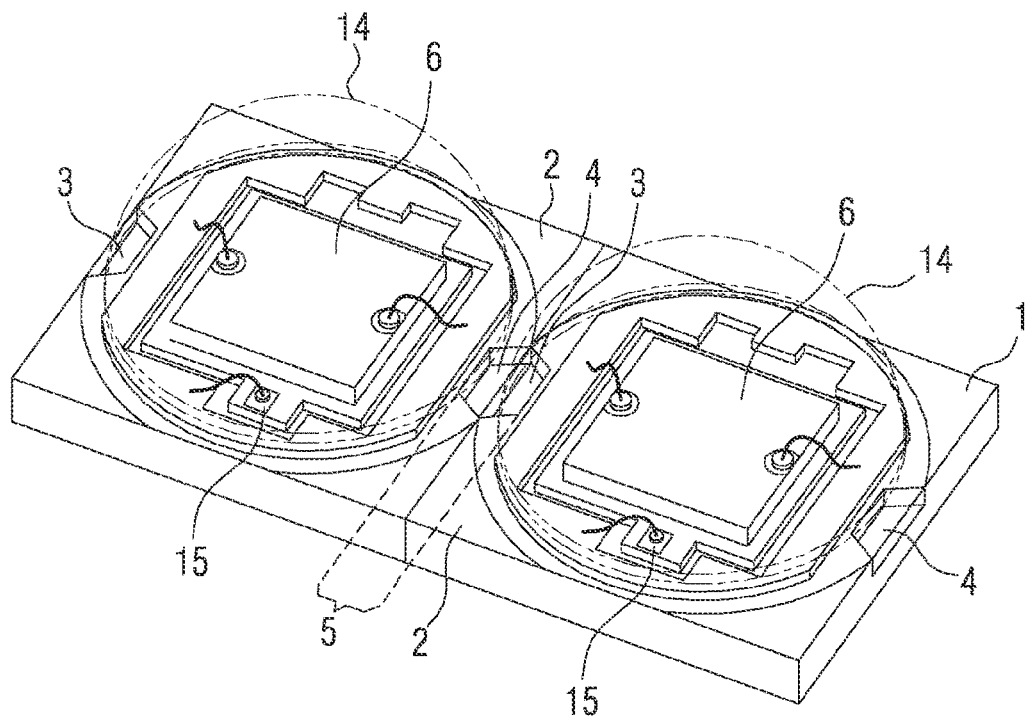
FIG. 6 shows a schematic perspective view of the phase of the method for production of a plurality of radiation-emitting devices according to FIG. 5.

FIG. 6 shows a perspective schematic view of the compound of FIG. 5. The compound of FIGS. 5 and 6 comprises a carrier 1 with at least two carrier elements 2, wherein on each carrier element 2 a radiation-emitting semiconductor chip 6 as already described in connection with FIG. 2 is arranged.

The carrier elements 2 comprise a core element and through holes covered by contact areas for electrically contacting the radiation-emitting semiconductor chips 6. The radiation-emitting semiconductor chip 6 is electrically connected to the contact areas by the help of wire bonds.

Furthermore, each radiation-emitting device comprises a protective diode 15, which serves for electrostatic discharge protection ("ESD protection"). The protective diode 15 is arranged next to the radiation-emitting semiconductor chip 6 on the main surface of the carrier element 2 and also electrically connected to the contact area by the help of a wire bond.

As can be seen in the perspective view of FIG. 6, each carrier element 2 comprises a first recess 3 and a second recess 4 extending from opposite side faces of the rectangular carrier element 2. The first recess 3 and the second recess 4 have a base area with the shape of a trapezoid, wherein the base area decreases with the distance from the side faces. The first recess 3 and the second recess 4 in the main surface of the direct neighbouring carrier elements 2 adjoin each other in order to form the continuous common recess 5 of the carrier 1.

By the help of the continuous common recess 5 it is possible to achieve molded lenses 14 in a batch process having outer surfaces 16, wherein regions 17 of the outer surfaces 16 directly adjacent to the main surface of the carrier elements 2 are free of planar areas. In particular, a mold base layer directly adjacent to the carrier element 2 comprised by common devices fabricated in a batch process is avoided. In such a way an easy method for the production of highly efficient semiconductor radiation-emitting devices can be provided.

In a next step, the radiation-emitting devices are separated into single radiation-emitting devices, for example by sawing.

Figure 7:
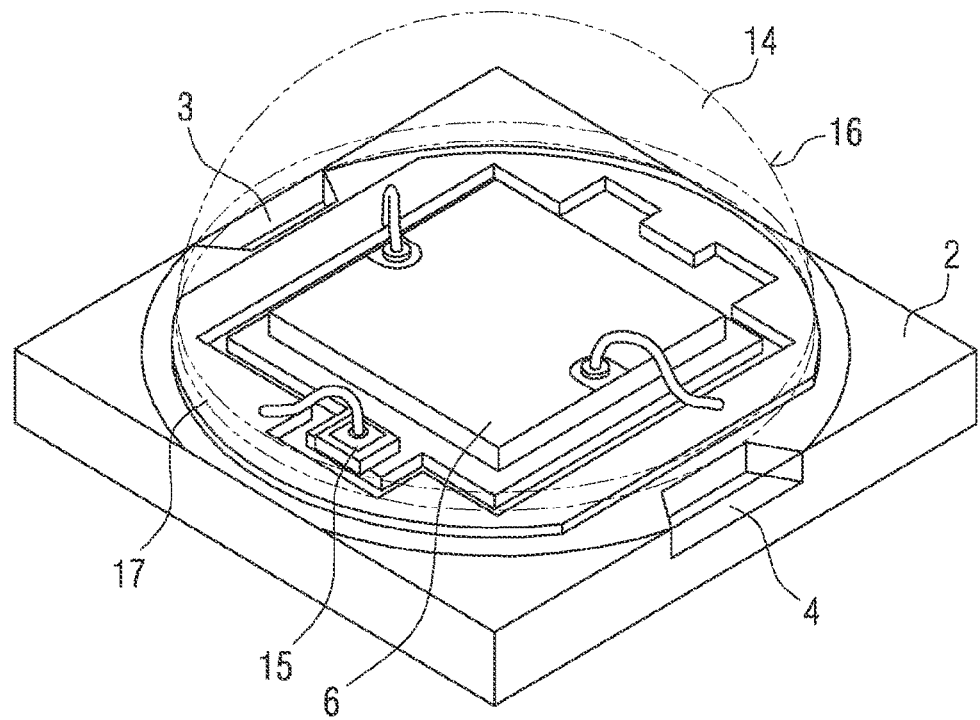
FIG. 7 shows a schematic perspective view of a radiation-emitting device according to an embodiment.

The radiation-emitting device according to the exemplary embodiment of FIG. 7 comprises a carrier element 2 having a first recess 3 and a second recess 4 in a main surface. The first recess 3 and the second recess 4 of the carrier element 2 are extending from opposite side faces of the rectangular carrier element 2.

On the main surface of the carrier element 2 a radiation-emitting semiconductor chip 6 is positioned. The radiation-emitting semiconductor chip 6 comprises a substrate 7, transparent for the electromagnetic radiation of the radiation-emitting semiconductor chip 6. On a main surface of the substrate 7 an epitaxial semiconductor layer sequence 8 is epitaxially grown. The epitaxial semiconductor layer sequence 8 has an active zone 9 generating the electromagnetic radiation of the radiation-emitting semiconductor chip 6 during operation. On a front side of the radiation-emitting semiconductor chip 6 two electrical contacts 10 are positioned.

The radiation-emitting semiconductor chip 6 emits electromagnetic radiation from a radiation exit surface during operation. The radiation exit surface comprises besides a main extension face of the radiation-emitting semiconductor chip 6 also side surfaces of the transparent substrate 7.

The radiation-emitting device further comprises a molded lens 14 completely encapsulating the radiation-emitting semiconductor chip 6. The molded lens 14 is transparent for the electromagnetic radiation of the active zone 9. For example, the molded lens 14 comprises silicone or is formed from silicone. The region 17 of an outer surface of the molded lens 14 directly adjacent to the main surface of the carrier element 2 is free of planar areas. In particular, the molded lens 14 is free of a base region directly adjoining the main surface of the carrier element 2 and having the shape of a substantially homogeneous layer. This is possible due to the first recess 3 and the second recess 4 in the carrier elements 2 forming continuous common recesses 5 in the carrier 1 during the manufacturing of the radiation-emitting devices as already explained in connection with FIGS. 1 to 6.

Figure 8:
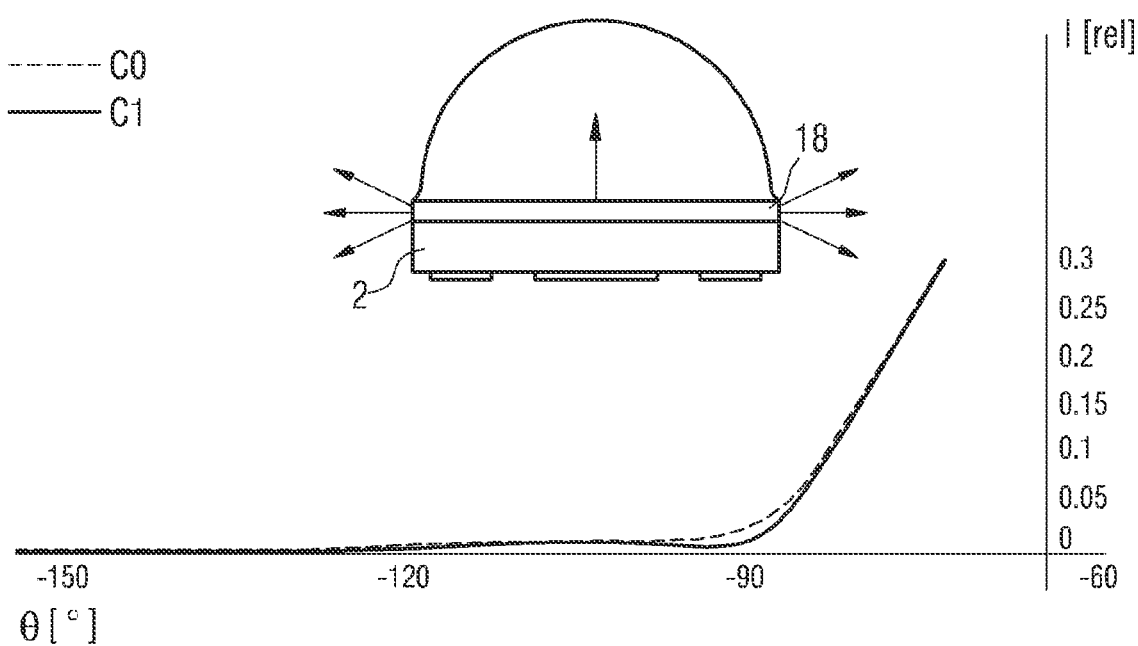
FIG. 8 shows a diagram of the simulated values of the relative intensity in dependence of the radiation angle of a common device and a diagram of the simulated values of the relative intensity in dependence of the radiation angle of a device according to FIG. 7.

FIG. 8 shows a diagram of the simulated relative intensity I(rel) in dependence of the radiation angel 6 as curve $C_o$(dashed) of the radiation emitted by a common radiation-emitting device comprising a mold base layer 18, which is a substantially homogenous layer directly adjoining the carrier element 2. Such a device is schematically also shown in FIG. 8. For the simulation of the values of curve $C_o$ it was assumed that the thickness of the mold base layer 18 is 0.25 millimetre.

Further, a curve $C_1$ with the simulated values of the relative intensity I(rel) in dependence on the radiation angle θ of a radiation-emitting device, which is free of mold base layer 18 is shown in FIG. 8. It can be seen from the simulation that approximately 0.7% of the electromagnetic radiation emitted by the semiconductor chip 6 is wasted at about 90 to 100° radiation angle within the common device comprising the mold base layer 18 compared to the radiation emitting device which is free of a mold base layer 18.

The invention is not limited to the description of the embodiments. Rather, the invention comprises each new feature as well as each combination of features, particularly each combination of features of the claims, even if the feature or the combination of features itself is not explicitly given in the claims or embodiments.

The invention claimed is:

1. A method for producing a plurality of radiation-emitting devices, the method comprising:
   providing a plurality of semiconductor chips on a main surface of a carrier, each semiconductor chip for emitting electromagnetic radiation from a radiation exit surface;
   arranging a lens mold with a plurality of cavities over the carrier;
   introducing a liquid mold material into the cavities of the lens mold; and
   curing the liquid mold material such that a plurality of molded lenses is generated, wherein the molded lenses directly adjoin the main surface of the carrier,
   wherein regions of an outer surface of the molded lenses directly adjacent to the main surface of the carrier are free of planar areas,
   wherein the carrier comprises a plurality of carrier elements,
   wherein each carrier element has a first recess in a main surface extending from a side face of the carrier element,
   wherein each carrier element has a second recess in the main surface extending from the side face of the carrier element, the second recess being arranged opposite to the first recess, and
   wherein the first recess and the second recess of direct neighboring carrier elements form a continuous common recess connecting two direct neighboring cavities of the lens mold with each other.

2. The method according to claim 1, wherein the liquid mold material flows through the common recess from a cavity to a direct neighboring cavity while introducing the liquid mold material into the cavities of the lens mold.

3. The method according to claim 1, wherein each cavity is arranged over the radiation exit surface of a semiconductor chip.

4. The method according to claim 1, wherein the cavities have an inverted shape of the molded lenses to be formed.

5. The method according to claim 1, wherein the liquid mold material is an uncured silicone.

6. The method according to claim 1, wherein each semiconductor chip is configured to emit the electromagnetic radiation from a side face.

7. The method according to claim 1, wherein each semiconductor chip comprises a substrate and an epitaxial semiconductor layer sequence arranged on the substrate, and wherein the substrate is transparent for the electromagnetic radiation of the semiconductor chip.

8. The method according to claim 1, wherein each molded lens is free of a base region directly adjoining the main surface of a carrier element, the base region having a shape of a homogeneous layer.

9. The method according to claim 1, wherein each outer surface of the molded lens has a shape of a hemispherical shell.

10. The method according to claim 1, wherein the first recess and/or the second recess is filled with the molded lens.

* * * * *